(12) United States Patent
Kawakami et al.

(10) Patent No.: US 6,432,208 B1
(45) Date of Patent: Aug. 13, 2002

(54) PLASMA PROCESSING APPARATUS

(75) Inventors: Satoru Kawakami; Katsuhiko Iwabuchi, both of Sagamihara; Ryo Kuwajima, Yamato; Ryusuke Ushikoshi, Tajimi; Naohito Yamada, Kasugai; Tetsuya Kawajiri, Ichinomiya, all of (JP)

(73) Assignees: Tokyo ELectron Limited, Tokyo; NGK Insulators, Ltd., Aichi, both of (JP)

( * ) Notice: Subject to any disclaimer, the term of this patent is extended or adjusted under 35 U.S.C. 154(b) by 0 days.

(21) Appl. No.: 09/670,580

(22) Filed: Sep. 27, 2000

Related U.S. Application Data

(63) Continuation of application No. PCT/JP00/02430, filed on Apr. 14, 2000.

(30) Foreign Application Priority Data

Apr. 15, 1999 (JP) .......................................... 11-107479

(51) Int. Cl.[7] ............................ C23C 16/00; H05H 1/00
(52) U.S. Cl. ....................... 118/728; 118/725; 118/724; 156/345.51; 156/345.52; 156/345.53
(58) Field of Search ................................. 118/728, 725, 118/724, 715; 156/345.52, 345.51, 345.53

(56) References Cited

U.S. PATENT DOCUMENTS

| | | | | |
|---|---|---|---|---|
| 5,290,381 A | * | 3/1994 | Nozawa et al. | 156/345 |
| 5,460,684 A | * | 10/1995 | Saeki et al. | 156/345 |
| 5,618,350 A | * | 4/1997 | Ishikawa et al. | 118/725 |
| 5,906,684 A | * | 5/1999 | Tamura et al. | 118/728 |
| 6,264,788 B1 | * | 7/2001 | Tomoyasu et al. | 156/345 |

FOREIGN PATENT DOCUMENTS

| JP | 4-196528 | | 7/1992 | |
|---|---|---|---|---|
| JP | 4-330722 A | * | 11/1992 | ......... H01L/21/205 |
| JP | 10-223621 | | 8/1998 | |

* cited by examiner

Primary Examiner—Gregory Mills
Assistant Examiner—P. Hassanzadeh
(74) Attorney, Agent, or Firm—Pillsbury Winthrop LLP

(57) ABSTRACT

In a plasma processing apparatus, a temperature control of a substrate to be processed is improved. A ceramic made support member having a substantially cylindrical shape is provided in a process chamber. An upper end of the support member is airtightly connected to a back surface of a placement table by solid state bonding. A lower end of the support member is airtightly connected to a bottom of the process chamber via a lower cooling jacket and O-rings. A cooling jacket made of a disc-like aluminum block is provided in an atmosphere chamber formed inside the support member. The cooling jacket is mounted to the back surface of the placement table via a heat conductive sheet member.

14 Claims, 3 Drawing Sheets

PLASMA PROCESSING APPARATUS

This is a continuation of International Application PCT/JP00/02430 filed Apr. 14, 2000.

TECHNICAL FIEND

The present invention relates to plasma processing apparatuses and, more particularly, to a plasma processing apparatus for applying a process using plasma to a substrate to be processed such as a semiconductor wafer placed on a placement table in a vacuum process chamber.

BACKGROUND ART

In a manufacturing process of semiconductor devices, plasma is used so as to promote ionization or chemical reaction of process gases in various processes such as etching, CVD or sputtering. Generally, in a processing apparatus using a plasma, a placement table is installed in a hermetically sealed processing chamber so as to place a semiconductor wafer on the placement table to apply a process to the semiconductor wafer.

FIG. 1 is an illustration showing a structure of a conventional typical plasma processing apparatus. In the plasma processing apparatus, a placement table 204 is installed in the center of a process chamber 200, which is a vacuum chamber, via a support member 202. The semiconductor wafer W as a substrate to be processed is placed on a placement surface 204a of the placement table 204, which is formed in a disc-like shape.

The replacement table 204 is provided with an electrostatic attracting (chucking) function so as to attracts and retain the semiconductor wafer W by an electrostatic force. In this processing apparatus, an upper portion of at least the placement surface 204a of the placement table 204 is constituted by an insulating material, and an electrode 206 is provided therein. An appropriate voltage is applied to the electrode 206 from a direct current power source 208 provided outside the process chamber 200 so as to have the placement surface 204a attract and retain the semiconductor wafer W by an electrostatic force.

In the process chamber 200, a plasma P is generated above the placement table 204 by an appropriate method, and is lead near the surface of the semiconductor wafer W. At the same time, a predetermined process gas is introduced into the process chamber 200. The molecules of the introduced process gas are excited by the plasma P, thereby promoting fine processing such as a film deposition or an etching.

Ions and electrons in the plasma P can be incident on the surface of the wafer W in a vertical direction by applying a high-frequency bias voltage to the electrode 206 of the placement table 204. Thereby, directionality (anisotropy) can be provided to a fine processing by the plasma processing, which improves an accuracy of processing. In order to apply the high-frequency bias voltage, a normally 23.5 MHz high-frequency power source 210 is provided outside the process chamber 200.

The placement table 204 is installed, via an O-ring, on the support member 202, which is formed in a disc-like or cylindrical shape. A gap (space) 214 formed inside the O-ring 212 is separated from the depressurized process space in the process chamber 200. A power supply line and the like connected to the placement table 204 from outside extend through a through hole (not shown in the figure) formed in the support member 202 and the gap 214.

The support member 202 is a block made of a material having a high heat-conductivity such as aluminum, and has a coolant passage 202a therein. A coolant (for example, water) of a predetermined temperature (for example, 25° C.) is supplied to the coolant passage 202a via a pipe (not shown in the figure) from a cooling apparatus (not shown in the figure) provided outside the process chamber 200. Thereby, the entire support member 202 is maintained at a predetermined temperature.

A heat of plasma transmitted to the placement table 204 via the semiconductor wafer W transmitted to the support member 202 from the placement table 204 via the gap 214. Then, the heat of plasma is absorbed by the coolant flowing through the coolant passage 202a formed in the support member 202, and is released to outside the chamber by the cooling apparatus. By this heat releasing mechanism, the temperature of the placement table 204 is maintained at a predetermined setting temperature (normally, equal to or lower than 200° C.).

The reason for maintaining the setting temperature at a temperature equal to or lower than 200° C. is that the O-ring 212 is in contact with a back surface of the placement table 204. That is, the O-ring 212 is formed by an elastic resin and a heat resistant temperature thereof is about 200° C. at maximum.

Maintaining the setting temperature of the placement table 204 at a temperature equal to or lower than 200° C. causes a large temperature difference between the placement table 204 and the semiconductor wafer W. In a general plasma process, a temperature of the wafer W is 400° C., and, thus, it is necessary to provide a temperature difference of about 200° C. between the two. The temperature difference is provided by contacting surfaces of the two and a thermal resistance of a space between the two.

It should be noted that a resistance heating element (not shown in the figure) may be provided inside the placement table 204, and an electrical control of an amount of heat generated by the resistance heating element is performed according to a temperature feedback function (not shown in the figure).

In the above-mentioned plasma process chamber, the temperature of the placement table 204 can be maintained at the setting temperature with a considerably high accuracy by the cooling by the support member 202 and the temperature control by heating by the equipped resistance heating element.

However, the with respect to the temperature of the wafer W which is an object whose temperature is to be controlled, it is difficult to compensate for with a fine thermal response in consideration of a temperature change caused by fluctuation in the plasma density and variation in a quality between individual wafers since the temperature difference between the semiconductor wafer W and the placement table 204. That is, it is difficult to maintain the temperature of the wafer W at a stable and uniform temperature.

Additionally, when starting the plasma processing, it is necessary to raise the temperature of the semiconductor wafer W to a temperature (setting temperature), at which the process can be started, after the semiconductor wafer W is placed on the placement table 204. This period is referred as a preheat time. If the temperature difference between the semiconductor wafer W and the placement table 204 is large as mentioned above, it is difficult to enhance the throughput since the preheat time is increased.

DISCLOSURE OF INVENTION

It is a general object of the present invention to provide an improved and useful plasma processing apparatus in which the above-mentioned problems.

A more specific object of the present invention is to provide a plasma processing apparatus which can obtain high throughput by reducing a preheat time from placement of a substrate to be processed on a placement table until the process is started.

In order to achieve the above-mentioned objects, there is provided according to the present invention a plasma processing apparatus for performing a process using a plasma with respect to a substrate to be processed within a depressurized process chamber, comprising:

a placement table, provided in said process chamber, having a placement surface for placing said substrate to be processed thereon and a back surface opposite to the placement surface; and a support member supporting said placement table, characterized in that said support member is provided between said placement table and a wall of said process chamber; said support member defines a space, which is separated from a process space of said process chamber, by being airtightly connected to said placement table and being airtightly connected to said process chamber; and said support member separates a connection part between said support member and the wall of said process chamber from said placement table by a predetermined distance so as to provide a predetermined thermal resistance between said placement table and said connection part.

According to the above-mentioned invention, since a predetermined thermal resistance is provided between said placement table and said connection part provided between the wall of the process chamber and the support member. Accordingly, the temperature of the connection part can be maintained at a low temperature while the placement table is maintained at the process temperature. Accordingly, connection part between the support member and the wall of the process chamber can be maintained to be equal to or smaller than a heat resistant temperature of rubber or plastics. That is, the connection part between the wall of the process chamber and the support member can be constituted by a seal member formed by rubber or plastics in an airtight manner.

Additionally, in the plasma processing apparatus according to the present invention, an elastic member for airtight connection may be provided to the connection part between the support member and the wall (10b) of the process chamber, and the connection part may be cooled by a first cooling means. By cooling the connection part by the first cooling means, an inexpensive seal member such as an O-ring or the like can be used as an elastic member for sealing.

Additionally, in the plasma processing apparatus according to the present invention, a second cooling means may be provided in the space separated by the support member so as to cool the placement table. By directly cooling the placement table by the second cooling means, the temperature of the placement table can be accurately and rapidly controlled.

Other objects, features and advantages of the resent invention will become more apparent from the following detailed description when read in conjunction with the accompanying drawings.

BEST MODE FOR CARRYING OUT THE INVENTION

A description will now be given, with reference to FIG. 3 and FIG. 4, of an embodiment of the present invention.

Figure 1:
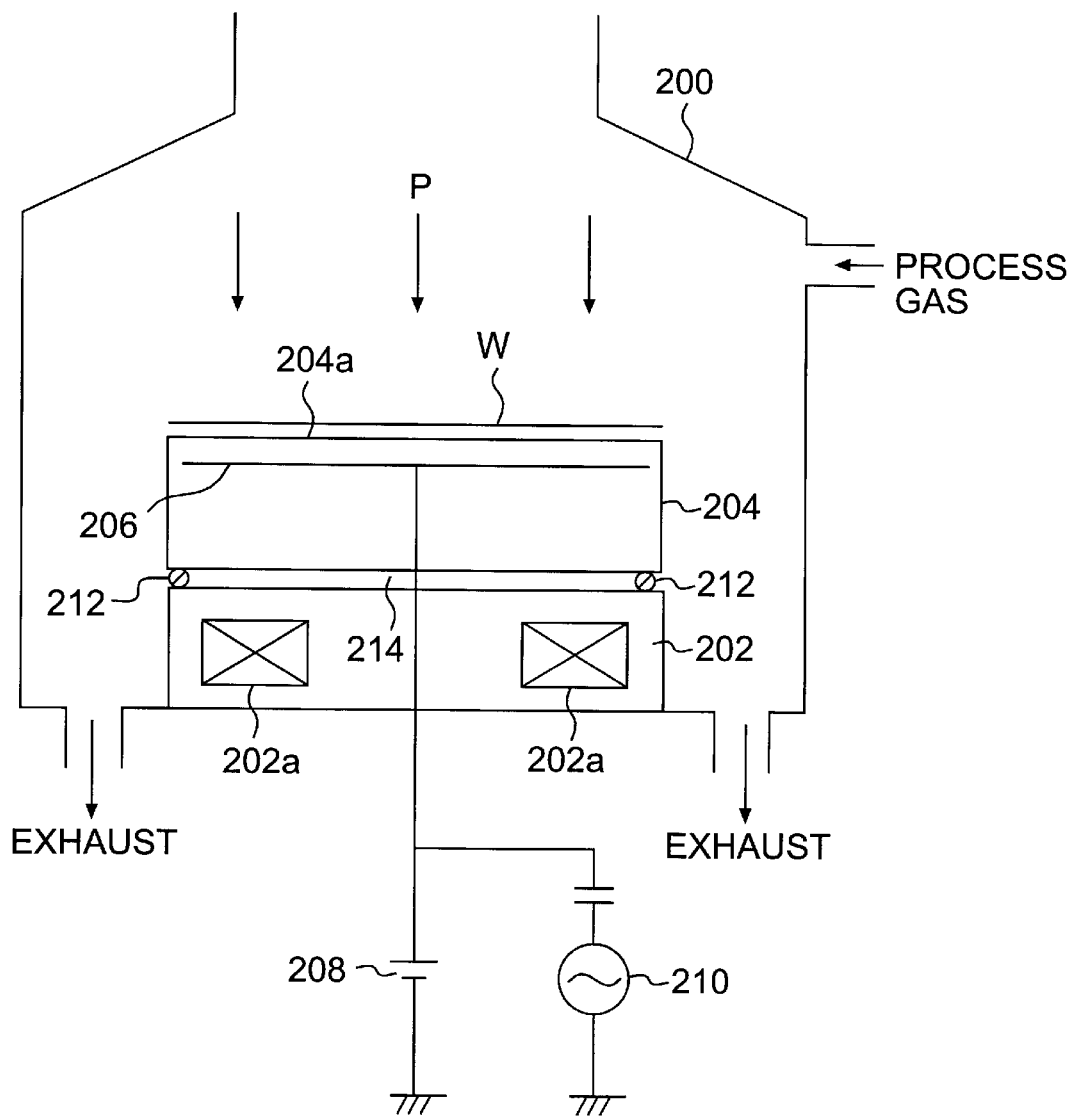
FIG. 1 is an illustration of an entire structure of a conventional plasma processing apparatus.
Figure 2:
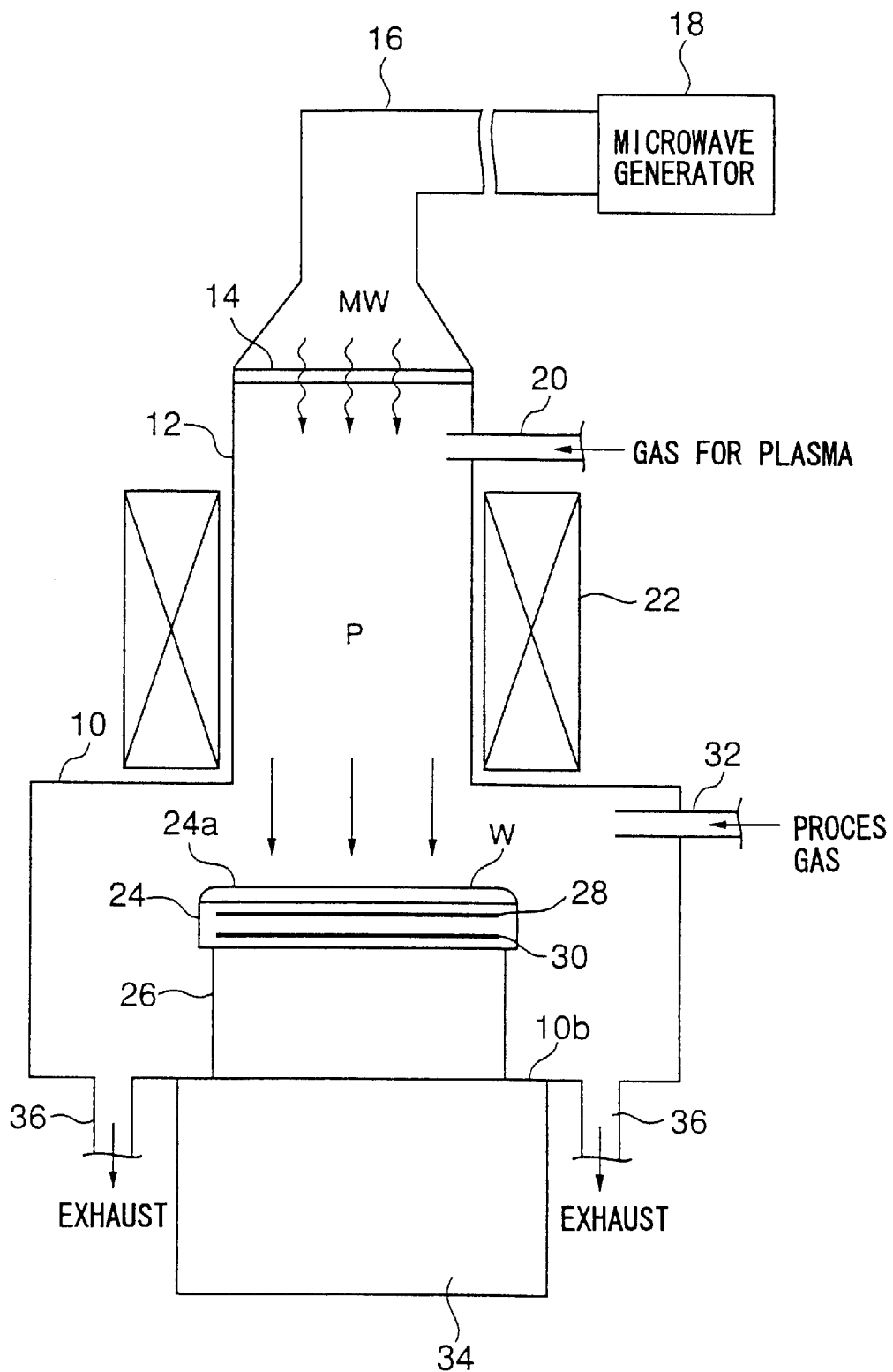
FIG. 2 is an illustration of an entire structure of a plasma processing apparatus according to an embodiment of the present invention.

FIG. 2 is an illustration of an entire structure of a plasma processing apparatus according to the embodiment of the present invention.

The plasma processing apparatus shown in FIG. 2 comprises a process chamber 10 which is a vacuum chamber having a process space which can be depressurized at a predetermined vacuum, a plasma generating chamber 12 communicating with the process chamber 10 and a waveguide tube 16 connected to the plasma generating chamber via a microwave transmission window 14.

A magnetron 18 which is a microwave generator is connected to an end of the waveguide tube 16. A 2.45-GHz microwave MW having a predetermined power and generated by the magnetron 18 is introduced into the plasma generating chamber 12 through the waveguide tube 16 and the transmission window 14.

A plasma gas such as argon (Ar) gas is also introduced into the plasma generating chamber 12 from an external plasma gas supplying source (not shown in the figure) via a pipe 20. An electromagnetic coil 22 is provided around the plasma generating chamber 22.

In the plasma generating chamber 12, the microwave MW is incident on the plasma gas within a magnetic field generated by the electromagnetic coil 22 so that a high-density plasma P is generated by the action of electron cyclotron resonance (ECR). The generated plasma P is introduced into the process chamber located underneath.

A disc-shaped placement table 24 is installed in the center of the process chamber 10. The placement table 24 is supported by a substantially cylindrical support member 26, which is airtightly connected to a bottom surface 10b of the process chamber In the present embodiment, both the placement table 24 and the support member 26 are formed of AlN (aluminum nitride) which is a ceramic material suitable for solid state bonding. As described later, the placement table 24 and the support member 26 are firmly and airtightly connected to each other.

The semiconductor wafer W which is a substrate to be processed is carried in the process chamber 10 through a gate valve (not shown in the figure) provided on a side wall of the process chamber 10, and is placed on the placement surface 24a of the placement table 24.

A thin film or sheet-like electrode 28 is embedded in the placement table 24 at an upper position close to the placement table 24a. As mentioned later, a direct current voltage for electrostatic attraction and a high-frequency voltage for attracting the plasma are supplied to the electrode 28.

Additionally, a resistance heating element 30 formed of a high melting point metal such as molybdenum or tungsten is provided in the placement table at a position inside (under) the electrode 28. As mentioned later, an electric power is supplied the resistance heating element 30 for heating the placement table 24.

A predetermined process (for example, $SiH_4$ in the case of CVD) gas is supplied to the process chamber from an external process gas supply source (not shown in the figure) via a pipe 32. Molecules of the process gas introduced into the process chamber 10 are activated by being excited by the plasma P, which results in deposition of a film on a surface of the wafer W or etching the surface of the wafer W.

At this time, a high-frequency voltage is applied to the electrode 28 of the placement table 24, and, thereby ions and electrons in the plasma P are incident on the semiconductor wafer w. Accordingly, the semiconductor wafer W is heated by the plasma heat and the reaction heat. Then, the heat is transmitted from the semiconductor wafer W to the placement table 24.

In the present embodiment, the inner side of the substantially cylindrical support member 26 is separated from the process space of the process chamber 10. That is, a space separated from the process space of the process chamber 10 is defined inside the support member 26. IN the present embodiment, inside the support member 26 forms an atmosphere chamber which is communicated with the atmosphere, and a cooling mechanism such as a cooling jacket for cooling the placement table 24 is provided in the atmosphere chamber. The temperature of the placement table 24 is maintained at a setting temperature (for example, a setting temperature of 350° C. which is slightly lower than 400° C.) of the semiconductor wafer W by the temperature control by cooling by the cooling jacket and heating by the resistance heating element incorporated in the placement table 24.

The lower end of the support member 26 is open, and the atmosphere chamber inside the support member 26 is communicated with an externally attached unit 34 provided under the process chamber 10. The externally attached unit 34 is provided with parts necessary for controlling an operation of the plasma processing apparatus such as a control circuit, a power source, a gas supply source, a cooling apparatus, a support pin up and down mechanism, etc. The space in the externally attached unit 34 may be always open to the atmosphere or open to the atmosphere if necessary according to a door opening system.

The process chamber 10 is connected to a vacuum pump (not shown in the figure) via a pipe 36 connected to one or a plurality of exhaust ports formed on the bottom surface thereof. The inside of the process chamber 10, more specifically, the process space excluding the atmosphere chamber inside the support member 26 can be maintained at a predetermined vacuum required by the plasma process by evacuation of the vacuum pump.

Figure 3:
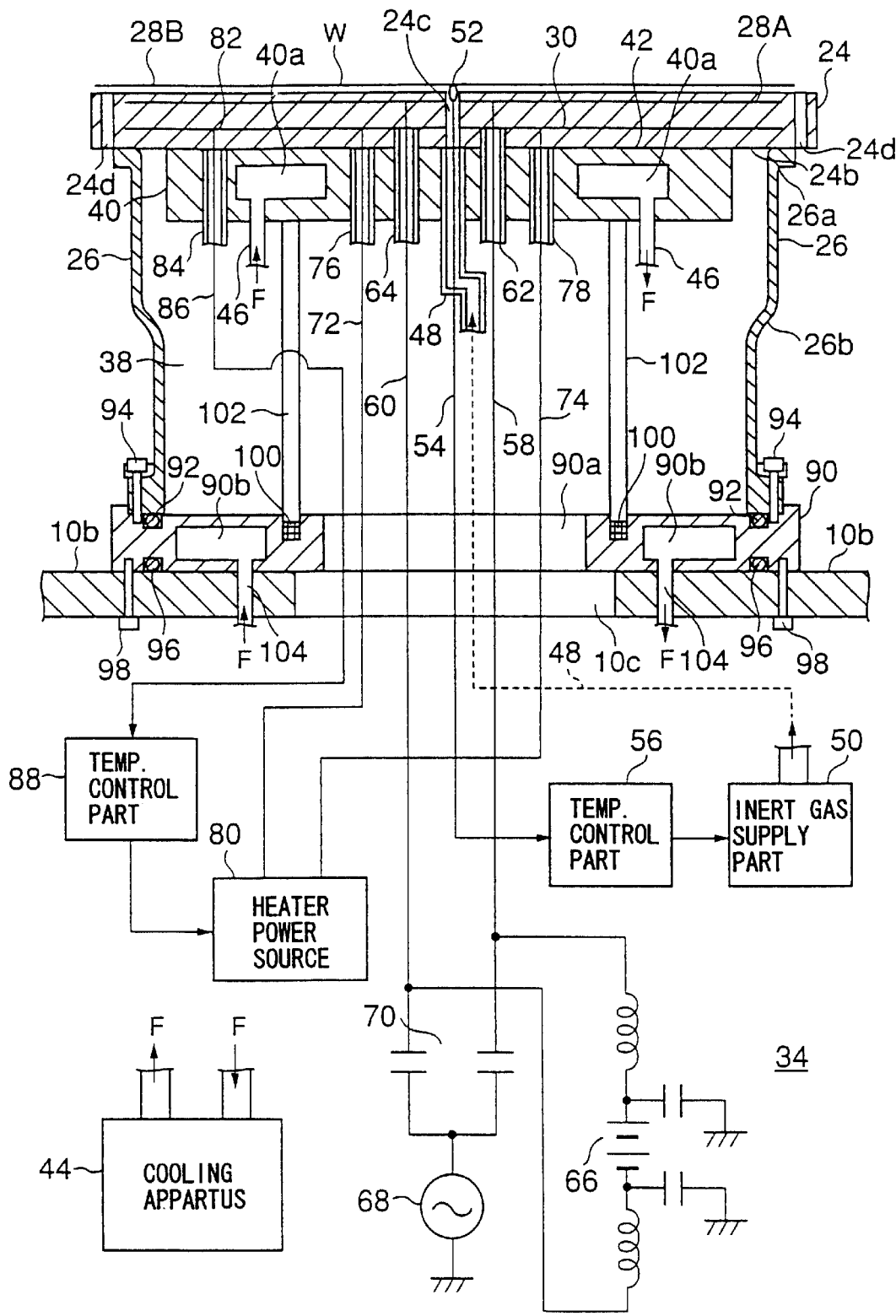
FIG. 3 is a cross-sectional view of a part of a plasma processing apparatus shown in FIG. 2.

FIG. 3 is a cross-sectional view of a structure of a part of the above-mentioned plasma processing apparatus including the support member 26. The atmosphere chamber 28 (the space separated from the process space of the process chamber 10) formed inside the support member 26 is provided with a cooling jacket 40. The cooling jacket 40 is constituted by a disc-like heat conductive member such as an aluminum block, and is mounted to the back surface 24b of the placement table 24 via a heat conductive sheet member such as a carbon sheet 42.

A coolant passage 40a extending in a circumferential direction is provided in the cooling jacket 40. A coolant F (for example, cooling water) of a predetermined temperature (for example, 25° C.) is supplied to the coolant passage 40a from the cooling apparatus 44 provided in the externally attached unit 34 via a pipe 46.

In the cooling jacket, a plurality of through holes are formed at a portion which avoids the coolant passage 40a so as to pass a power line, a sense line, a gas supply pipe and the like through to the placement table 24.

An insulating gas supply pipe 48 is passed through the through hole provided in the center of the cooling jacket 40.

A through hole 24c for a gas passage is provided in the center of the placement table 24 so as to oppose to an upper open end of the gas supply pipe 48.

In operation, an inert gas such as helium (He) gas for controlling a temperature of the wafer is supplied in the periphery of the semiconductor wafer W from an inert gas soupy part 50 provided in the externally attached unit 34 via the gas supply pipe 48 and the through hole 24c.

A recessed portion or a groove having an appropriate pattern may be formed in the placement surface 24a of the placement table 24 so that the inert gas reaches the entire back surface of the semiconductor wafer W by transmitting through the recessed portion or the groove. The temperature of the wafer W can be adjusted by varying a gap or a thermal resistance of the contacting surface between the placement table 24 and the semiconductor wafer W by controlling a gas pressure of the inert gas.

A temperature sensor 52 is provided to an upper portion of the through hole 24c of the placement table 24 in a state in which the temperature sensor slightly protrudes from the hole 24c so as to detect the temperature of the semiconductor wafer W. An output terminal of the temperature sensor 52 is electrically connected to a sense line 54, which is loose fitted to the through hole 24c and the gas supply line 48. The sense line 54 passes through the atmosphere chamber and is lead to a temperature control part 56 of the externally attached unit 34. The temperature control part 56 controls a flow or a pressure of the supply gas at the inert gas supply part 50 according to a predetermined feedback control method such as PID control method based on a temperature detection signal from the temperature sensor 52.

The electrode embedded in the placement table 24 is divided into a pair of electrode pieces 28A and 28B according to an opposite polarity attracting method. The pair of electrode pieces 28A and 28B are electrically connected to respective conductive lines or conductive rods 58 and 60 so as to supply a direct current voltage for electrostatic attraction and a high-frequency voltage for attracting the plasma.

The conductive lines 58 and 60 pass though respective insulating sheaths 62 and 64, which are fit in the though hole of the cooling jacket 40, and are lead out to the atmosphere chamber 38. The conductive lines 58 and 60 are electrically connected to an electrostatic attraction direct current power source 66 and a plasma attraction high-frequency power source 68 in the externally attached unit 34 by being passed through the atmosphere chamber 38.

The direct current power source 66 supplies, at a predetermined voltage value, a positive voltage having a predetermined voltage value to one electrode piece 28A and a negative voltage to the other electrode 28B. The high-frequency power source 68 supplies 13.56-MHz high-frequency voltage at a power of 2 kW to both to electrode pieces 28A and 28B via a matching box 70.

Power lines 72 and 74 for heating are connected to terminals of the resistance heating element 30 embedded in the placement table 24. The power lines 72 and 74 pass through respective insulating sheaths 76 and 78 inserted into the through hole of the cooling jacket 40, and lead out to the atmosphere chamber 38. The power lines 72 and 74 are connected to a heater power source 80, which is a 200-V alternating current power source in the externally attached unit 34, by being passed through the atmosphere chamber 38.

A temperature sensor 82 for detecting a temperature of the placement table is mounted to the placement table 24 by an embedding method or a contacting method. A sense line or conductive rod 86 is electrically connected to an output terminal of the temperature sensor 82 by being passed through an insulating sheath 84 inserted into the through hole of the cooling jacket 40. The sense line 86 passes through the atmosphere chamber 38 and is connected to a temperature control part 88 of the externally attached unit 34. The temperature control part 88 controls an amount of output (supply) of an electric power at the heater power source 80 according to a predetermined feedback control method such as PID control method based on a temperature detection signal from the temperature sensor 82.

It should be noted that the wire such as the sense lines 54 and 86, the conductive lines 58 and 69 and power lines 72 and 74 may be an insulator jacketed cable.

A through holes 24*d* are provided at three positions along the periphery of the placement table 24, and, when the semiconductor wafer W is transferred, a support pin (not shown in the figure) protrudes from the placement surface 24*a* in the respective one of the through holes 24*d*.

The upper end surface of the support member 26 is airtightly connected to a portion of the back surface 24*b* of the placement table 24 which portion is inner side of the through holes 24*d* by solid state bonding. In the present embodiment, the bonding is performed by a solid state bonding method for ceramics such as disclosed in Japanese Patent Publication No. 2-783980. In the solid state bonding according to this solid state bonding method for ceramics (AlN in the present case), a layer, in which atoms of a bonding assist agent is enriched, is present along a bonding interface between the bonded materials (24, 26), and ceramics particles grow so as to extends on each side of the bonding interface. Thereby, airtightness of the bonding portion is high, and the strength thereof is equal to or greater than that of portions other than the bonding portion. The bonding assist agent may be the same material (AlN) as the bonded materials (24, 26), or may be an yttrium compound or the like.

Such a solid state bonded material can be obtained by applying a solution of the bonding assist agent to one of the materials to be bonded and then applying a heat treatment to each ceramic materials in a state in which the materials to be bonded are brought in contact with each other, a center line mean roughness (Ra) of a bonding surface of each ceramic material to be bonded being equal to or smaller than 0.2 $\mu$m and flatness thereof being equal to or smaller than 0.2 $\mu$m. It should be noted that the process temperature of the heat treatment can be equal to or higher than (T-50)°C. when the sintering temperature of the ceramics materials is T°C.

The lower end of the support member 26 is airtightly connected to the bottom 10*b* of the process chamber 10 via a ring-like lower cooling jacket 98 having a center opening 90*a*. The lower end surface of the support member 26 is placed on the periphery of the upper surface of the lower cooling jacket 90 via an O-ring 92, and a plurality of bolts 94 are screwed into corresponding threaded holes of the lower cooling jacket 90 via a lower thick portion of the support member 26 at appropriate intervals in a circumferential direction. Thereby, the lower cooling jacket 90 is also airtightly connected to the bottom 10*b* of the process chamber 10 via the O-ring 96.

As mentioned above, the support member 26 in the present embodiment has a substantially cylindrical shape, and the upper end thereof is airtightly connected to the back surface 24*b* of the placement table 24 by solid state bonding, and the lower end thereof is airthightly connected to the bottom 10*b* of the process chamber 10 via the lower cooling jacket 90 and the O-rings 92 and 96. According to the airtight shielding construction, the process space of the process chamber 10 is isolated from both the atmosphere chamber 38 inside the support member 26 and the atmospheric pressure space of the externally attached unit 34 so that the process space can be maintained at a desired vacuum.

It should be noted that the support member 26 of the present embodiment is provided with bent portions 26*a* and 26*b* in the upper end portion and in the middle portion thereof so as to relax a stress.

The bottom 10*b* of the process chamber is also provided with a center opening 10*c* at a position corresponding to the center opening 90*a* of the lower cooling jacket 90. The atmosphere chamber 38 inside the above-mentioned support member 26 and the externally attached unit 34 are communicated with each other under an atmospheric pressure via the openings 90*a* and 10*c*. Additionally, electric wires and pipes are lead into the atmosphere chamber 38 by being passed through the openings 90*a* and 10*c*.

A plurality of counter bores are formed in the upper surface of the lower cooling jacket 90 at predetermined intervals in the circumferential direction. Perpendicular support rods 102 are uprightly provided in the counter bores via compression coil springs 100, respectively. An upper end of each of the perpendicular support rods 102 is pressed against a back side of the upper cooling jacket 40 in the atmosphere chamber 38 by an elastic force of each of the coil springs 100.

As mentioned above, the placement table 24 is supported on the bottom 10*b* of the process chamber 10 via the upper cooling jacket 40, which is supported on the lower cooling jacket 90 via the perpendicular support rods 102 and the compression coil springs 100. According to the internal support mechanism, a load to the support member 26 to support the weight of the placement table 24 is reduced.

A coolant passage 90*b* extending in a circumferential direction is formed in the cooling jacket 90. A coolant F (for example, cooling water) of a predetermined temperature (for example, 25° C.) is supplied to the coolant passage 90*b* from the cooling apparatus 44 of the externally attached unit 34 via a pipe 104.

As mentioned above, in the plasma processing apparatus, the placement table 24 for the semiconductor wafer W is supported by the substantially cylindrical, airtight type support member 26 in the vacuum process chamber 10, and the placement table 24 is cooled at a predetermined temperature by providing the cooling jacket 40 in the atmosphere chamber 38 formed inside the airtight type support member 26. The coolant is supplied to the cooling jacket 40 via the atmosphere chamber 38. Additionally, the wiring of the electric system such as a power supply to the electrode 28 and the resistance heating element 30 in the placement table 24 for supplying a power such as the electrostatic attracting voltage or the plasma attraction voltage is achieved via the atmosphere chamber 38.

As mentioned above, the placement of the cooling jacket 40 for cooling the placement table or the provision of gas pipes or electric wires under an atmospheric pressure provides not only easy design and fabrication of the apparatus but also convenience with respect to the apparatus maintenance.

Additionally, in the plasma processing apparatus, the support member 26 is airtightly bonded to the placement table by solid state bonding, and the O-rings 90 and 96 are used for the airtight connection between the support member 26 and the lower cooling jacket 90 at the lower end of the support member and the airtight connection between the lower cooling jacket 90 and the process chamber 10, respectively.

Here, the O-rings 90 and 96 are cooled at the temperature (25° C.) of the lower cooling jacket 90, there is no possibility of thermal degradation. Accordingly, the setting temperature of the placement table 24 can be selected to be an arbitrary temperature, preferably a value (for example, 350° C.) slightly lower than the setting temperature (for example, 400° C.) of the semiconductor wafer W, irrespective of the heat resistance temperature (lower than 200° C.) of the O-rings 90 and 96.

As mentioned above, by setting the setting temperature of the placement table 24 to a temperature close to the setting temperature of the semiconductor wafer W, variation in the temperature of the semiconductor wafer W sue to a fluctuation in the plasma density or variation between individual wafers can be accurately compensated for at a good response speed. Accordingly, the wafer temperature can be stably and uniformly maintained at the setting value, which results in an improvement in the plasma processing quality. Further, the preheat time from the placement of the semiconductor wafer W on the placement table 24 until the start of the process can be reduced, thereby increasing the throughput.

Additionally, the support member 26 is constituted by a heat conductive ceramic material, and the lower end thereof is heat bonded to the lower cooling jacket 90. Thereby, the heat of the placement table 24 can be released to outside the process chamber 10 via the support member 26 and the lower cooling jacket 90, which improves the cooling effect.

It should be noted that the size of the support member 26, especially the dimension of the height, is determined based on an amount of heat consumed by the heat conduction in the support member 26. Assuming that the temperature difference between the setting temperature of the placement table 24 and the setting temperature of the lower cooling jacket 90 is $\Delta T$(°C.); an amount of heat of the plasma incident on the placement table 24 is J (watts) and a thermal resistance of the support member 26 is $\lambda$ (°C./watt), $\Delta T$ and J are given as known values (design values). Accordingly, the thermal resistance $\lambda$ can be obtained by the following equation (1).

$$\Delta T = \lambda \times J$$

$$\lambda = \Delta T / J \tag{1}$$

The thermal resistance $\lambda$ is determined by a thermal conductivity (characteristic value), a transverse sectional area (design value) and a length of a material forming the support member 26. Accordingly, the necessary height of the support member 26, that is, the distance between the placement table and the lower cooling jacket 90 can be obtained from the values of the thermal resistance $\lambda$ and the transverse sectional area.

In the above-mentioned embodiment, although the support member 26 is formed by AlN (aluminum nitride), other ceramics such as silicon nitride may be used. That is, an arbitrary material can be used for the support member 26 if the material does not degrade in the process chamber and airtight bonding can be performed and preferably the material has a high thermal conductivity.

The configuration of the support material 26 is not limited to the cylindrical shape, and a polygon column may be used. In the above-mentioned embodiment, although the lower cooling jacket 90 is provided between the support member 26 and the bottom 10b of the process chamber 10, a temperature controlling means may be provided in the bottom 10b of the process chamber 10 and the support member may be directly connected to the bottom 10b of the process chamber 10. Additionally, a part to which the support member 26 is mounted is not limited to the bottom 10b, and the support member 26 can be mounted to a sidewall of the process chamber 10. Additionally, in the above-mentioned embodiment, although the support ember 26 is bonded to the back surface 24b of the placement table 24, the support member 26 may be bonded to a side surface of the placement table 24.

A structure in the atmosphere chamber 38 inside the support member 26 can also be varied and altered. An arbitrary thermal coupling can be achieved between the placement table 24 and the cooling jacket 40, and, for example, the heat conductive sheet 42 can be eliminated to form a gap. The type or temperature of the coolant used for the cooling jacket 40 can be selected from various types and temperatures, and a coolant (temperature) or a cooling apparatus different from that used for the lower cooling jacket 90 may be used. Additionally, the cooling jacket 40 may be replaced with a cooling means having a different structure or cooling system.

The structure of the placement table 24 in the above-mentioned embodiment is one example, and a various placement table structures may be used. For example, the electrode 28 can be a single (single polarity) structure. Additionally, a placement table, which does not have the inert gas passage for wafer temperature control or the heating element for controlling the placement temperature, may be used.

In the above-mentioned embodiment, although the plasma is generated by ECR method, other plasma generating methods such as a parallel flat plate method, a magnetron method, a microwave method, etc may be used. The substrate to be processed is not limited to the semiconductor wafer, and an LCD substrate or a glass substrate may be used.

As mentioned above, according to the plasma processing apparatus of the present invention, the temperature control with respect to the substrate to be processed is improved, and, thereby, improvement in the plasma processing quality and throughput can be achieved.

The present invention is not limited to the specifically disclosed embodiments, and variations and modifications may be made without departing from the scope of the present invention.

What is claimed is:

1. A plasma processing apparatus for performing a process using a plasma with respect to a substrate to be processed within a depressurized process chamber, comprising:

a placement table, provided in said process chamber, having a placement surface for placing said substrate to be processed thereon and a back surface opposite to the placement surface; and a support member supporting said placement table, wherein said support member is provided between said placement table and a wall of said process chamber; said support member defines a space, which is separated from a process space of said process chamber, by being airtightly connected to said placement table without O-rings and being airtightly connected to said process chamber; and said support member is operatively coupled to the wall of said process chamber in a region that is separated from and directly below said placement table by a distance so as to provide a thermal resistance between said placement table and the region where said support member and the wall of said process chamber are operatively coupled; and said support member extends in a vertical direction between said placement table and said wall of said process chamber.

2. The plasma processing apparatus as claimed in claim 1, wherein an elastic member for airtight connection is provided to the region between said support member and the wall of said process chamber where said support member and said wall of said processing chamber are operatively coupled, and also first cooling means is provided for cooling said region.

3. The plasma processing apparatus as claimed in claim 1, further comprising second cooling means is further provided in said separated space for cooling said placement table.

4. The plasma processing apparatus as claimed in claim 3, wherein said second cooling means comprises:
   a heat conductive member mounted to the back surface of said placement table, a coolant passage being formed in the heat conductive member; and
   coolant supplying means for supplying a coolant to said coolant passage via said separated space.

5. The plasma processing apparatus as claimed in one of claims 1 to 4, wherein each of said placement table and said support member is made of a ceramic material, and are joined to each other by solid state bonding.

6. The plasma processing apparatus as claimed in claim 5, characterized in that said ceramics material is aluminum nitride (AlN).

7. The plasma processing apparatus as claimed in one of claims 1 to 4, further comprising:
   an electrode provided in said placement table; and
   electrostatic attraction voltage supplying means for supplying a voltage to said electrode via said separated space so as to generate an electrostatic attracting force with respect to said substrate to be processed.

8. The plasma processing apparatus as claimed in one of claims 1 to 4, further comprising:
   an electrode provided in said placement table; and
   high-frequency voltage supplying means for supplying a high-frequency voltage to said electrode via said separated space so as to pull a plasma in said substrate to be processed.

9. The plasma processing apparatus as claimed in one of claims 1 to 4, further comprising:
   an electric heating element provided in said placement table; and
   electric heating element power supplying means for supplying an electric power to said electric heating element via said separated space.

10. The plasma processing apparatus as claimed in one of claims 1 to 4, further comprising:
    a gas passage provided in said replacement surface of said placement table; and
    temperature control gas supplying means for supplying an inert gas to said gas passage via said separated space so as to control a temperature of said substrate to be processed.

11. The plasma processing apparatus as claimed in one of claims 1 to 4, further comprising an inner support member provided in said separated space so as to support said placement table.

12. The plasma processing apparatus as claimed in claim 1, wherein said placement table is capable of being maintained at a temperature greater than or equal to at least 350° C.

13. The plasma processing apparatus as claimed in claim 1, wherein said region where said support member and said wall of said process chamber are operatively coupled is capable of being maintained at a temperature of of 200° C. or less when said placement table is being maintained at a temperature of at least 350° C.

14. The plasma processing apparatus has claimed in claim 1, further comprising an O-ring to operatively couple said support member to the wall of said process chamber.

* * * * *